United States Patent
Uno

(10) Patent No.: US 7,095,031 B2
(45) Date of Patent: Aug. 22, 2006

(54) METHOD OF AUTOMATICALLY CORRECTING ABERRATIONS IN CHARGED-PARTICLE BEAM AND APPARATUS THEREFOR

(75) Inventor: Shinobu Uno, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 11/016,687

(22) Filed: Dec. 17, 2004

(65) Prior Publication Data

US 2005/0189496 A1 Sep. 1, 2005

(30) Foreign Application Priority Data

Dec. 17, 2003 (JP) ............... 2003-419858

(51) Int. Cl.
*G21K 1/08* (2006.01)
*H01J 3/14* (2006.01)
*H01J 3/26* (2006.01)
*H01J 1/50* (2006.01)

(52) U.S. Cl. .................. 250/396 R; 250/396 ML
(58) Field of Classification Search .......... 250/396 R, 250/396 ML
See application file for complete search history.

(56) References Cited

U.S. PATENT DOCUMENTS

| | | | | |
|---|---|---|---|---|
| 5,298,757 | A * | 3/1994 | Okayama | 250/396 R |
| 6,025,600 | A * | 2/2000 | Archie et al. | 250/396 R |
| 6,930,312 | B1 * | 8/2005 | Matsuya et al. | 250/396 R |
| 7,012,262 | B1 * | 3/2006 | Rose | 250/396 ML |
| 7,030,389 | B1 * | 4/2006 | Kaneyama | 250/399 |

FOREIGN PATENT DOCUMENTS

JP 2003-521801 A 7/2003

OTHER PUBLICATIONS

Von H. Rose, "Abbildungseigeschaften sphärisch korrigieter elektronenoptischer Achromate" (Properties of Spherically Corrected Achromatic Electron-Lenses). *Optic 33*, Heft 1, 1971, pp. 1-24.

M. Haider, W. Bernhardt, and H. Rose, "Design and test of an electric and magnetic dodecapole lens", *Optic 63*, No. 1, 1982, pp. 9-23.

J. Zach, "Design of a high-resolution low-voltage scanning electron microscope", *Optic 83*, No. 1, 1989, pp. 30-40.

Joachim Zach, Maximilian Haider, "Aberration correction in a low voltage SEM by a multiple corrector", *Nuclear Instruments and Methods in Physics Research*, A 363, 1995, pp. 316-325.

* cited by examiner

Primary Examiner—David A. Vanore
(74) Attorney, Agent, or Firm—The Webb Law Firm

(57) ABSTRACT

The present invention provides method and apparatus for automatically correcting aberrations in a charged-particle beam. The apparatus extracts line profiles from the probe profile of the charged-particle beam. Features indicative of the line profile, i.e., $\mu$, $\sigma$, and $\rho$ indicating left-and-right asymmetry, width, and unevenness around the center, respectively, are extracted. An aberration amount calculator calculates amounts of aberrations corresponding to aberrations, respectively, in the charged-particle beam from the amounts of features $\mu$, $\sigma$, and $\rho$. An aberration corrector corrects the aberrations in the beam.

7 Claims, 9 Drawing Sheets

US 7,095,031 B2

METHOD OF AUTOMATICALLY CORRECTING ABERRATIONS IN CHARGED-PARTICLE BEAM AND APPARATUS THEREFOR

BACKGROUND OF THE INVENTION

1. Field of the Invention

The present invention relates to a method of automatically correcting aberrations in a charged-particle beam and to an apparatus therefor.

2. Description of Related Art

In scanning electron microscopes and transmission electron microscopes, an aberration corrector is built in the electron optical system to permit high-resolution imaging and to enhance the probe current density. A system consisting of an aberration corrector having four stages of multipole units has been proposed as the first-mentioned built-in aberration corrector. Each multipole unit has twelve pole elements. Chromatic aberration is corrected by a combination of an electrostatic quadrupole mode of operation and a magnetic quadrupole mode of operation. Spherical aberration is corrected by four stages of octopole mode of operation. The principle is introduced in detail in H. Rose, *Optik* 33, Heft 1, 1–24 (1971); and J. Zach, *Optik* 83, No. 1, 30–40 (1989); J. Zach and M. Haider, *Nucl. Instru. and Meth. In Phys. Res.* A 363, 316–325 (1995).

The principle of the above-described aberration corrector is described briefly with reference to FIG. 8. In FIG. 8, an aberration corrector C is disposed ahead of an objective lens 7 and equipped with four stages of multipole units 51, 52, 53, and 54. Each of the multipole units 51–54 has twelve pole elements. Electric potentials 1, 2, 3, and 4 are applied to the multipole elements 51–54, respectively, to activate the electrostatic quadrupole elements. Exciting currents 5 and 6 are supplied to the second and third stages of multipole units 52 and 53, respectively, to produce magnetic potential distribution analogous to the electric potential distribution created by the potentials 2 and 3 and to produce a magnetic field superimposed on the electric field. Furthermore, electric potentials 11, 12, 13, and 14 are applied to the multipole units 51–54, respectively, to activate an electrostatic octopole element for producing an electric field superimposed on the electric field produced by the potentials 1–4 that are used to activate the quadrupole.

In actual instrumentation, electric fields produced by dipole-activating potential (acting as a deflector for axial alignment) and hexapole-activating potential (acting to correct second-order aperture aberration) are superimposed on the electric fields produced by the quadrupole-activating and octopole-activating potentials. Since these superimposed fields are hardly related directly with aberration correction for which the present invention is intended, they will not be described in detail below.

In the configuration of FIG. 8, with respect to a charged-particle beam B entering from the left side as viewed in the figure, a reference orbit for the beam B is created by the four stages of multipole units 51–54 and objective lens 7. The beam B is focused onto a specimen surface 20. In FIG. 8, X-direction orbit $R_x$ and Y-direction orbit $R_y$ of the beam B are both schematically drawn on the same plane.

The reference orbit can be understood as a paraxial orbit that is assumed when there is no aberration. That is, the Y-direction orbit $R_y$ is made to pass through the center of the multipole unit 52 by the multipole unit 51. The X-direction orbit $R_x$ is made to pass through the center of the multipole unit 53 by the multipole unit 52. Finally, the charged-particle beam B is focused onto the specimen surface 20 by the multipole units 53, 54 and objective lens 7. In practice, these need to be adjusted mutually for complete focusing. At this time, the dipole-activating potentials applied to the four stages of multipole units 51–54 are used for axial alignment.

Referring more particularly to FIG. 8, the charged-particle beam B in the X-direction orbit $R_x$ is diffused by the multipole unit 51 acting like a concave lens. Then, the beam is focused by the multipole unit 52 acting like a convex lens and made to pass through the center of the multipole unit 53. Then, the beam is focused by the multipole unit 54 and moves toward the objective lens 7. On the other hand, the beam B in the Y-direction orbit $R_y$ is focused by the multipole unit 51 and made to pass through the center of the multipole unit 52. Then, the beam is focused by the multipole unit 53. Finally, the beam is diffused by the multipole unit 54 and moves toward the objective lens 7. By combining the diffusive action of the multipole unit 51 acting on the orbit $R_x$ in the X-direction and the diffusive action of the multipole unit 54 acting on the orbit $R_y$ in the Y-direction in this way, the electron optical system can be operated like a single concave or convex lens.

Correction of chromatic aberration in the charged-particle beam B using the aberration corrector C is next described. To correct chromatic aberration in the system shown in FIG. 8, electric potential $\phi_{q2}$ [V] acting as an electrostatic quadrupole element and magnetic excitation $J_2$ [AT] (or magnetic potential) acting as a magnetic quadrupole element are adjusted such that the reference orbit remains unchanged. The whole lens system acts to correct the X-direction chromatic aberration to zero. Similarly, electric potential $\phi_{q3}$ [V] acting as an electrostatic quadrupole element and magnetic excitation $J_3$ [AT] acting as a magnetic quadrupole element are adjusted such that the reference orbit is not affected. The whole lens system acts to correct the Y-direction chromatic aberration to zero.

Correction of spherical aberration (correction of the third-order aperture aberration) in the charged-particle beam B is next described. Spherical aberration is corrected after X- and Y-direction chromatic aberrations are corrected. The X-direction spherical aberration in the whole lens system is corrected to zero by electric potential $\phi_{o2}$ [V] acting as an electrostatic octopole element. The Y-direction spherical aberration is corrected to zero by electric potential $\phi_{o3}$ [V] acting as an electrostatic octopole element.

Then, the spherical aberration in the resultant direction of the X- and Y-directions is corrected to zero by the electric potentials 11 and 14 for activating the electrostatic octopole elements. In practice, repeated mutual adjustments are necessary. Superimposition of the potentials and magnetic excitations for activation of quadrupole and octopole elements has been put into practical use by using a single unit having twelve pole elements and varying the potential or magnetic excitation applied to each pole of the twelve pole elements so as to synthesize dipoles, quadrupoles, hexapoles, octopoles, etc. This method has been introduced, for example, in M. Haider et al., *Optik* 63, No. 1, 9–23 (1982).

In particular, in an electrostatic design, a final stage of power supplies $A_n$ (n=1, 2, . . . , 12) capable of supplying a voltage to twelve electrodes $U_n$ (n=1, 2, . . . , 12) independently is connected as shown in FIG. 9. Where a quadrupole field is produced, output voltages from a quadrupole power supply 10 are supplied to the final-stage power supplies $A_n$ to obtain a field close to an ideal quadrupole field. If it is assumed that the output voltages from the final-stage power supplies $A_n$ are proportional to the output voltages from the quadrupole power supply 10, the ratio of the output voltages from the power supply 10 assumes a value as given in the M. Haider et al., Id. Where an octopole field is created to be superimposed on this quadrupole field, output voltages from an octopole power supply 18 are added to the output voltages from the quadrupole power supply 10 and supplied to the final-stage power supplies $A_n$ to obtain a field close to an ideal octopole field. Subsequently, based on a similar concept, a field on which a multipole field produced by operation of a 2n-pole element (n=1, 2, ..., 6) is superimposed is obtained by activating the twelve poles formed on a single unit.

In a magnetic design, a final stage of power supplies B, (n=1, 2, ..., 12) capable of supplying excitation currents to the coils on twelve magnets $W_n$ (n=1, 2, ..., 12) independently is connected as shown in FIG. 10. Where a magnetic quadrupole field is created, output voltages from a magnetic quadrupole power supply 15 are supplied to the final stage of power supplies $B_n$ to produce a field close to an ideal magnetic quadrupole field. If it is assumed that the output currents from the final-stage power supplies $B_n$ are proportional to the output voltage from the magnetic quadrupole power supply 15, the ratio of the output voltages assumes an exciting magnetic force ratio as given in the above-quoted M. Haider et al. reference. Superimposition of multipole fields other than a magnetic quadrupole field is not explained herein. However, a magnetic multipole field can be superimposed in the same way as in the electrostatic design, by adding voltages for multipole fields to the input voltage to the final-stage power supplies $B_n$. A yoke for magnetically connecting the outside portions of the magnets $W_n$ is omitted in FIG. 10.

When electrostatic and magnetic designs are superimposed, a conductive magnetic material may be used so that the magnets $W_n$ can act also as the electrodes $U_n$. In this case, the coils on the magnets are disposed so as to be electrically isolated from the electrodes.

In the description given below, the 2n-pole elements are treated as if they were stacked on top of each other to simplify the explanation. In practice, superimposition of plural multipole fields on a dodecapole (twelve-pole) element mounted on a single unit is achieved by adding voltage signals as mentioned previously.

After end of correction of chromatic aberration in the charged-particle beam B, it may be necessary to correct the second-order aperture aberration by means of three or four stages of hexapole elements before the correction of spherical aberration is performed. This correction is made in the same procedure as in the aforementioned correction of spherical aberration. This second-order aperture aberration occurs depending on the mechanical accuracy of the aberration corrector. Normally, the amount of correction is small, and this aberration affects higher-order aberrations only a little within the scope of the present aberration corrector. Furthermore, the second-order aperture aberration is corrected within the aberration corrector. If the resultant magnification (described later) of the aberration corrector and the objective lens is varied, higher-order aberrations are affected little, though the resultant magnification is important in aberration correction. For these reasons, description of the correction of the second-order aperture aberration is omitted in the description of the prior art.

A method of detecting geometric optics aberrations up to the third order using a probe, especially in a scanning microscope equipped with a point light source, lenses, an object, and a detector, is known, for example, as described in Unexamined Japan Patent Number P2003-521801 (paragraphs 0006–0008, FIG. 1).

The aforementioned procedure of the prior art correction of aberrations in a charged-particle beam is complex. There is the problem that it takes a considerable time for an ordinary operator to master the technique and obtain high-resolution images.

SUMMARY OF THE INVENTION

In view of the foregoing, the present invention has been made. It is an object of the present invention to provide a method and apparatus permitting an operator to automatically and easily correct aberrations in a charged-particle beam unconsciously of a complex procedure of aberration correction.

A method of automatically correcting aberrations in a charged-particle beam in accordance with the present invention comprises the steps of: extracting line profiles from a probe profile of the charged-particle beam when it has been defocused; calculating amounts of features $\mu$, $\sigma$, and $\rho$ from the extracted line profiles, the $\mu$, $\sigma$, and $\rho$ indicating features of the line profiles, i.e., left-and-right asymmetry, width, and unevenness around the center; calculating amounts of aberrations in the charged-particle beam from the amounts of features $\mu$, $\sigma$, and $\rho$; making a decision as to whether a total amount of aberration in the charged-particle beam calculated based on the amounts of aberrations is less than a given threshold value; and specifying at least one of the amounts of aberrations, calculating an amount of feedback for reducing the specified amount of aberration, and correcting the aberrations in the charged-particle beam based on the amount of feedback when the total amount of aberration has been judged to be greater than the threshold value by the step of making a decision.

An apparatus for automatically correcting aberrations in a charged-particle beam in accordance with the present invention comprises: a line profile extractor for extracting line profiles from a probe profile of the charged-particle beam when it has been defocused; a line profile feature amount extractor for calculating amounts of features $\mu$, $\sigma$, and $\rho$ from the extracted line profiles, the $\mu$, $\sigma$, and $\rho$ indicating features of the line profiles, i.e., left-and-right asymmetry, width, and unevenness around the center; an aberration amount calculator for calculating amounts of aberrations in the charged-particle beam from the amounts of features $\mu$, $\sigma$, and $\rho$; an aberration amount decision-making device for making a decision as to whether a total amount of aberration in the charged-particle beam calculated based on the amounts of aberrations is less than a given threshold value; a feedback amount-setting device for specifying at least one of the amounts of aberrations and calculating an amount of feedback for reducing the specified amount of aberration; and an aberration corrector for correcting the aberrations in the charged-particle beam based on the amount of feedback.

According to the method of automatically correcting aberrations in a charged-particle beam in accordance with the present invention, the amount of feedback to be applied to the aberration corrector to correct the aberrations in the beam is automatically calculated. Therefore, the operator can easily and automatically correct the aberrations in the beam unconsciously of a complex procedure.

Furthermore, according to the apparatus for automatically correcting aberrations in a charged-particle beam in accordance with the present invention, the amount of feedback to be applied to the aberration corrector to correct the aberrations in the beam is automatically calculated using various processing circuits. Consequently, the operator can easily and automatically correct the aberrations in the beam unconsciously of a complex procedure.

Other objects and features of the present invention will appear in the course of the description thereof, which follows.

DESCRIPTION OF THE PREFERRED EMBODIMENTS

Preferred embodiments of the present invention are hereinafter described in detail with reference to the accompanying drawings.

Figure 1:
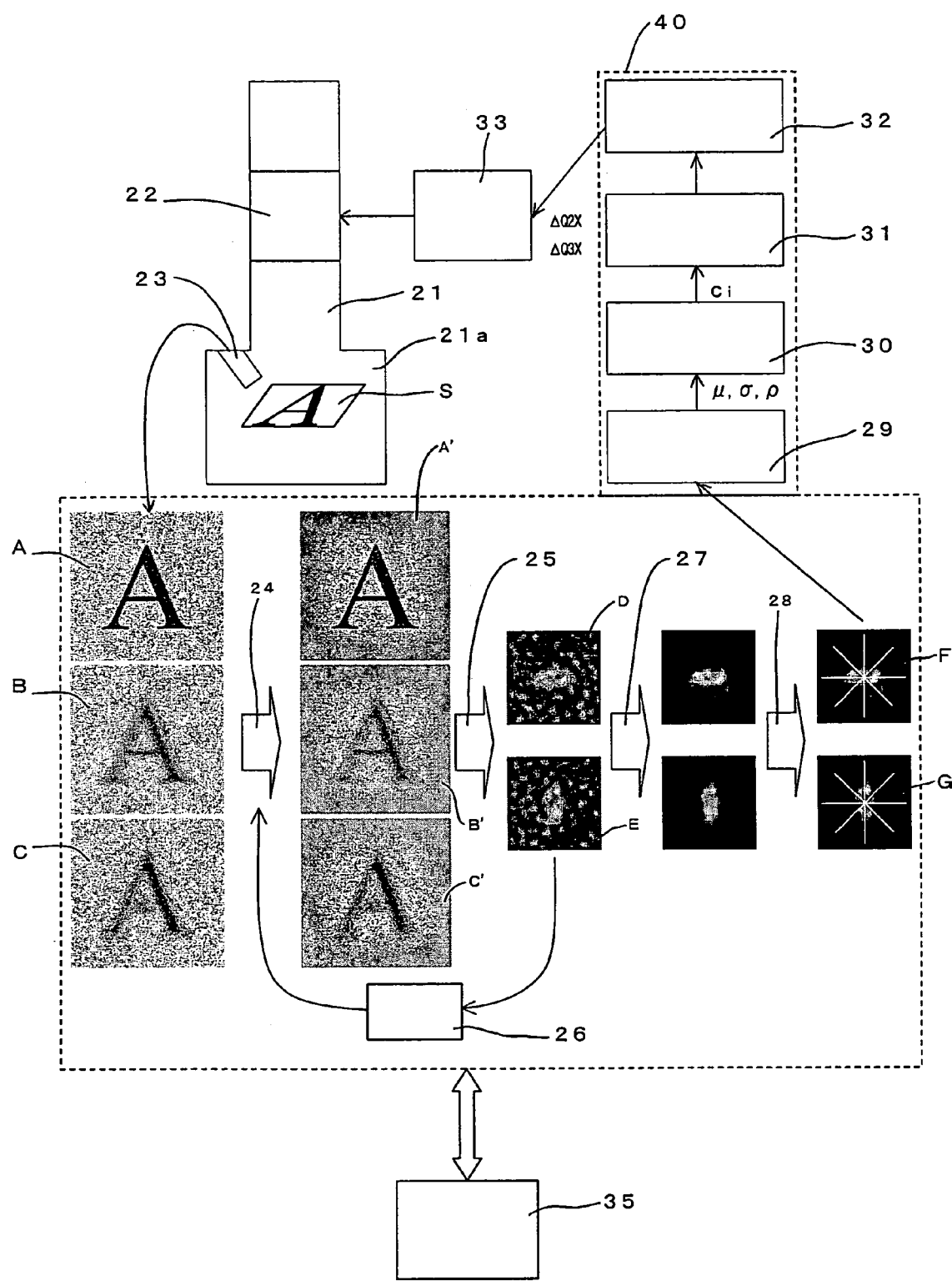
FIG. 1 is a diagram showing one embodiment of the present invention.
Figure 8:
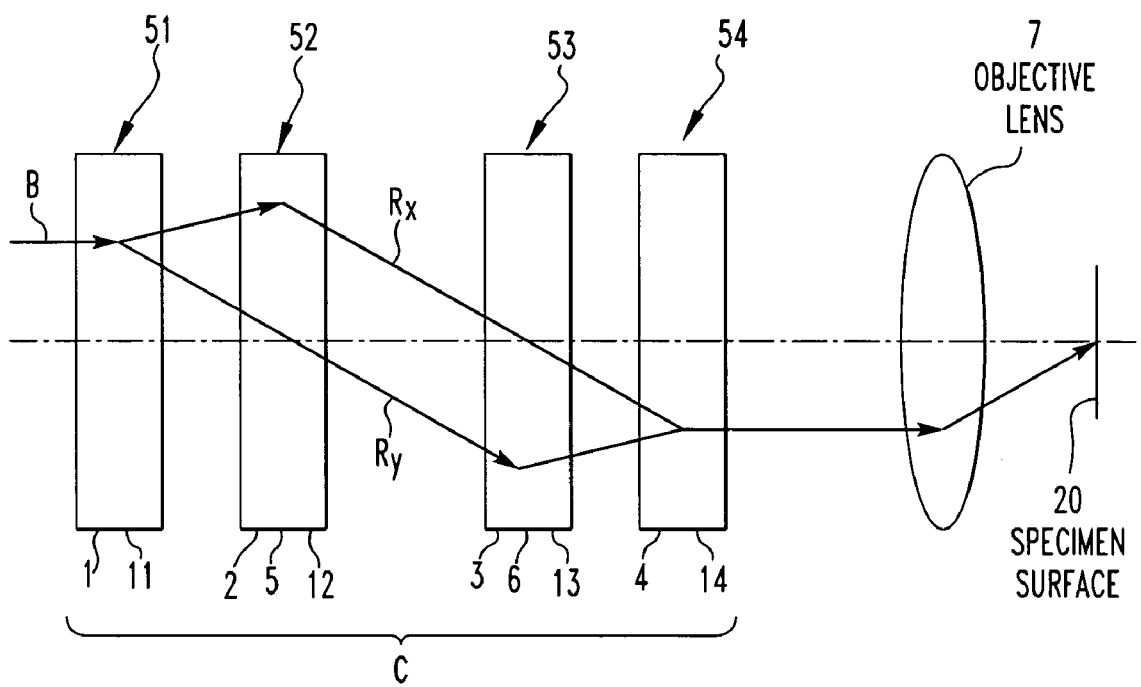
FIG. 8 is a diagram illustrating the principle of operation of the aberration corrector.
Figure 9:
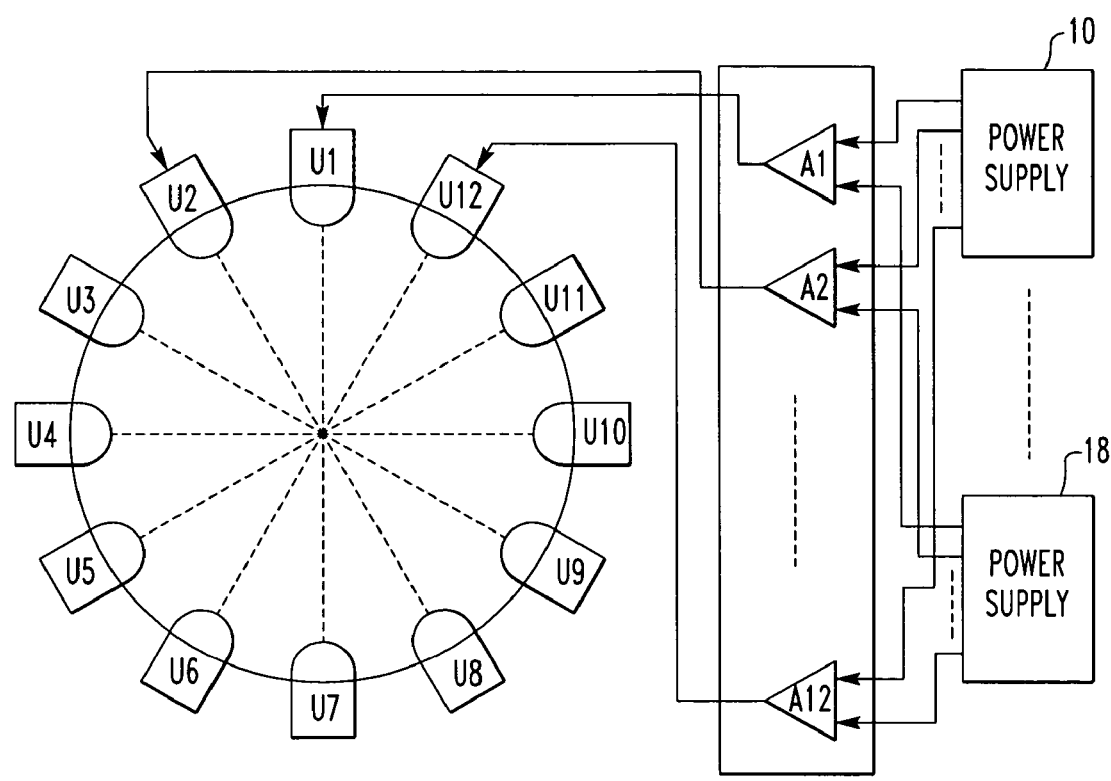
FIG. 9 is a diagram illustrating a method using an electrostatic dodecapole element as an electrostatic multipole element having less than twelve poles.
Figure 10:
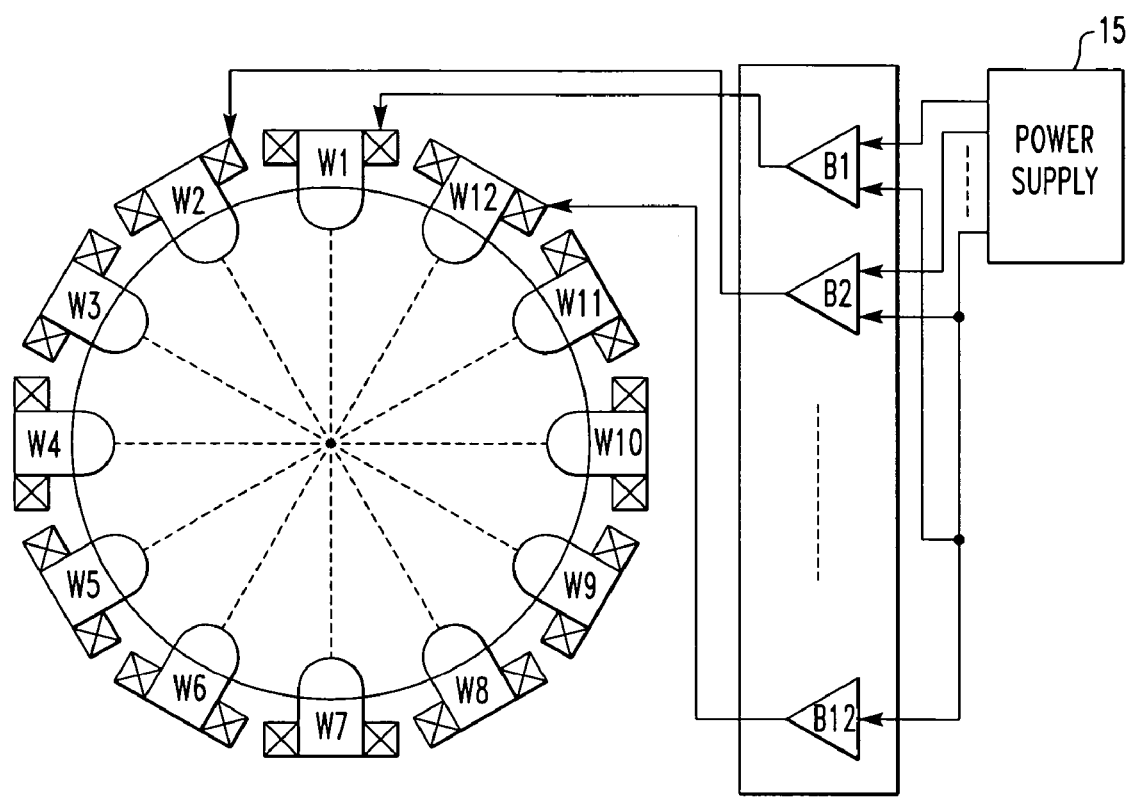
FIG. 10 is a diagram illustrating a method using a magnetic dodecapole element as a magnetic multipole element having less than twelve magnetic poles.

FIG. 1 shows the configuration of one embodiment of the present invention. In FIG. 1, indicated by numeral 21 is the body of an apparatus having the configuration of an SEM. An aberration corrector 22 is mounted in the body 21 of the apparatus. The corrector 22 is designed as shown in FIG. 8. The body 21 of the apparatus has a specimen chamber 21a in which a specimen S is placed. A character "A" as shown is formed on the surface of the specimen S. The specimen S is irradiated with an electron beam that is one kind of charged-particle beam. As a result, secondary electrons and other electrons are emitted from the surface of the specimen S. The secondary electrons are detected by a detector 23. A to C show specimen images detected by the detector 23. The image A is obtained when the beam is accurately focused. The image B is obtained when the beam is underfocused. The image C is obtained when the beam is overfocused.

Figure 2:
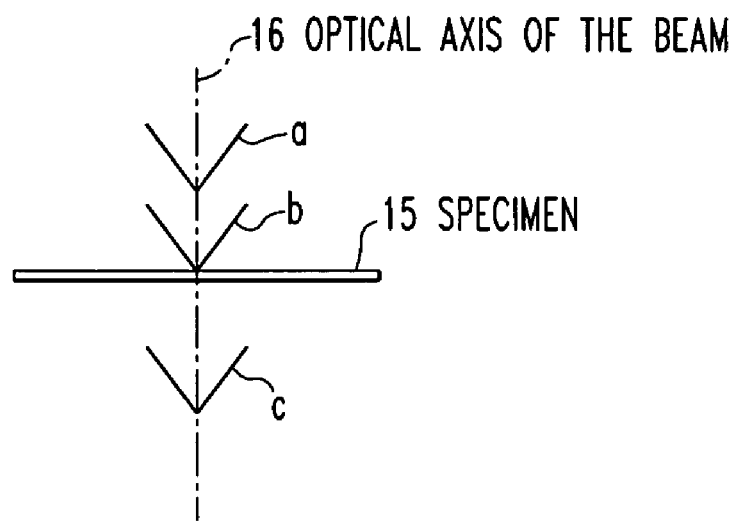
FIG. 2 shows the manner in which a beam is focused onto a specimen.

FIG. 2 shows the state in which the electron beam is focused onto a specimen. In this figure, the specimen is indicated by numeral 15. The optical axis of the beam is indicated by numeral 16. In FIG. 2, a indicates the state in which the beam is focused above the specimen 15, b indicates the state in which the beam is focused onto a surface of the specimen 15, and c indicates the state in which the beam is focused under the surface of the specimen 15. In the state a, the beam is excessively restricted by a lens and so the beam is focused above the surface of the specimen 15. Hence, this is an overfocused condition. In the state b, the beam is accurately focused onto the surface of the specimen 15. In the state c, the beam is insufficiently restricted, so that the beam is focused under the surface of the specimen 15. This is an underfocused condition. In the case of the image b, the image is blurred laterally. In the case of the image C, the image is blurred vertically.

The image detected by the detector 23 is converted into a digital image and then stored in a memory 35. A four-side region-blurring device 24 reads each image stored in the memory 35 and blurs regions close to the four sides of the image. The probe profile extractor 25 receives the output from the blurring device 24 and extracts the profile of each probe. A', B', and C' are images respectively obtained after the images A, B, and C have passed through the blurring device 24. An S/N adjuster 26 adjusts the S/N of the image extracted by the probe profile extractor 25 and reduces the noise. The output from the S/N adjuster 26 is fed back to the four-sided region-blurring device 24, where the background noise is removed. In the figure, D indicates the cross-sectional shape of the electron probe when the beam is underfocused, and E indicates the cross-sectional shape of the probe when the beam is overfocused. The cross-sectional shape of the electron probe may hereinafter be referred to as the profile of the probe.

A noise remover 27 receives the output from the probe profile extractor 25 and removes the noise. A line profile extractor 28 sets lines as shown for the probe profile from which the noise has been removed, and extracts line profiles in the directions of the lines. F indicates the state in which the lines are set for an underfocused probe. G indicates the state in which the lines are set for an overfocused probe.

Each line profile is entered into the correction amount-calculating means 40, where the "amount of correction to aberration" is computed. A corrector power supply 33 adds the "amount of correction to aberration" to the aberration corrector 22 based on the amount of correction computed by the calculating means 40.

In the correction amount-calculating means 40, a line profile feature amount-extracting device 29 receives the output from the line profile extractor 28 and extracts amounts of features of the line profile. The amounts of features consist of $\mu$ indicating the left-and-right asymmetry of the line profile, $\sigma$ indicating the width of the line profile, and $\rho$ indicating the unevenness around the center of the line profile. An aberration calculator 30 receives the output from the line profile feature amount-extracting device 29 and calculates parameters $C_i$'s indicating aberrations (where i is an integer). An aberration correction decision-making device 31 receives the output from the aberration calculator 30 and makes a decision as to whether there still remains aberration to be corrected. A feedback amount-setting device 32 receives the output from the decision-making device 31 and sets an amount of feedback to reduce the aberration. The corrector power supply 33 receives the output from the setting device 32 and produces an output that drives the aberration corrector 22. A memory 35 stores specimen images taken in. For example, a magnetic disk drive is used as this memory 35. The operation of the apparatus constructed in this way is described below.

In FIG. 1, the electron beam emitted from an electron gun (not shown) passes through the aberration corrector 22. At this time, the beam undergoes an aberration correction and is focused on the specimen S. Secondary electrons or backscattered electrons produced from the surface of the specimen are detected by the detector 23. Then, the output signal from the detector 23 is converted into digital image data by an A/D converter (not shown) and then stored in the memory 35. Each image stored in the memory 35 can take one of three states; one (b) is precisely focused state of the electron beam as shown in FIG. 2, another (c) is an underfocused state, and the remaining one (a) is an overfocused state.

The image data stored in the memory 35 is read out and then enters the four-side region-blurring device 24, where artifacts around the four sides of the image are removed. The images blurred in this way by the four-side region-blurring device 24 are indicated by A', B', and C', respectively. Then, the probe profile extractor 25 extracts the probe profile. Examples of probes whose profiles have been extracted by the extracting device 25 are indicated by D and E. D indicates the profile obtained in an underfocused state. E indicates the profile obtained in an overfocused state. The image of the profile of each probe is automatically adjusted by the S/N adjuster 26 and fed back to the four-side region-blurring device 24. In consequence, the average size of background noises contained in the probe profile can be reduced to a minimum.

Figure 3:
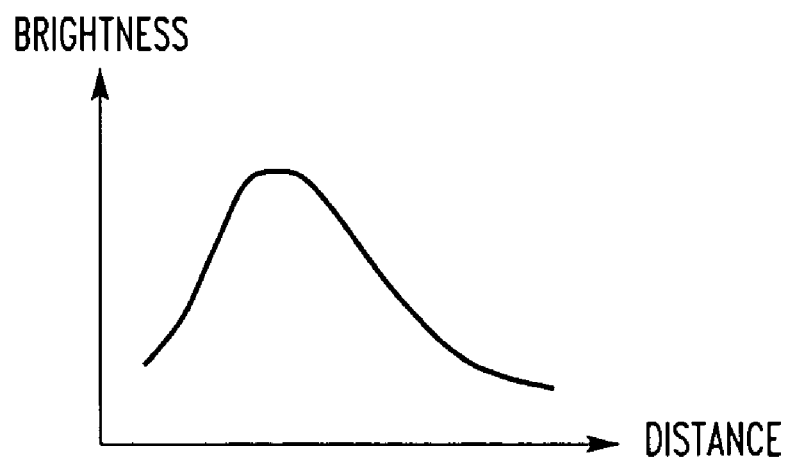
FIG. 3 is a graph showing one example of line profile.

After the noises in the image of the probe profile have been removed by the noise remover 27, the image enters the line profile extractor 28, where profiles based on plural lines are extracted as indicated by F and G. FIG. 3 shows one example of the line profile obtained in this way. In this graph of FIG. 3, the horizontal axis indicates distance, while the vertical axis indicates brightness. The obtained line profile is passed into the following line profile feature amount-extracting device 29, where the parameters $\mu$, $\sigma$, and $\rho$ indicative of the features of the line profile are extracted. The aberration calculator 30 enters these parameters, or amounts of features $\mu$, $\sigma$, and $\rho$, and computes a parameter $C_i$ (where i is an integer) used as a measure indicating each aberration.

The output from the aberration calculator 30 enters the aberration correction decision-making device 31, which receives the outputs $C_i$'s from the aberration calculator 30 and makes a decision as to whether there still remains aberration to be corrected. The feedback amount-setting device 32 finds a field to be applied to the aberration corrector 22 to correct the aberration specified by the aberration correction decision-making device 31 out of the outputs $C_i$'s from the aberration calculator 30. Amounts of correction $\Delta Q2x$ and $\Delta Q3x$ output from the feedback amount-setting device 32 are entered into the corrector power supply 33. This power supply 33 applies voltages for correcting the aberration corrector 22 according to the amounts of correction to the aberration corrector 22. As a result, the corrector 22 corrects the aberrations in the electron beam. Consequently, the beam free of aberrations can be directed at the specimen S.

As mentioned previously, according to the present invention, the amount of feedback to be applied to the aberration corrector is automatically calculated in order to correct the aberrations in the electron beam. Consequently, the operator can automatically correct the conditions under which the aberration corrector is driven unconsciously of a complex procedure. Aberrations in the beam can be corrected easily and automatically.

The operations of the aforementioned components are described in detail below.

(a) Four-Side Region-Blurring Device

The values of the pixels of an image are passed through a filter that acts to vary the values of the pixels in such a way that the values of pixels located closer to any one of the four sides of the image are made closer to a constant value. Thus, image regions close to the four sides are blurred.

(b) Probe Profile Extractor

The case of underfocusing is taken as an example. An underfocused image is Fourier-transformed. The result is divided by the Fourier transform of the optimally focused image and multiplied by the inverse Fourier transform of the probe profile when the beam is optimally focused. Then, the result is Fourier-transformed. Thus, the probe profile in an underfocused state is found. In particular, when the probe profile is extracted when the beam is underfocused, optimally focused and underfocused images are used. The probe profile obtained when the beam is optimally focused is sufficiently smaller than the probe profile when the beam is underfocused. Therefore, it is not necessary to know the profile in detail. Specifically, a Gaussian distribution of a width that is experimentally found using the resolution as a measure will suffice. When the beam is overfocused, the probe profile is found similarly.

(c) S/N Adjuster

Plural values of the amount by which the regions close to the four sides are blurred in (a) are attempted. The probe profile is found as in (b) about each of the values. The average size $\epsilon$ of background noises contained in the probe profile is found. The probe profile that minimizes the size $\epsilon$ is adopted. For example, the root mean square of pixels having sizes less than $\alpha$ times the maximum value is used as the average size $\epsilon$, where $\alpha$ is an experimentally found parameter.

(d) Noise Remover

This is used to remove background noise contained in the probe profile found in (c). The method is implemented as follows, for example.

The root mean square of pixels having sizes less than a times the maximum value is set to $\epsilon$. The center of gravity of a set of pixels having sizes exceeding $\alpha$ times the maximum value is given by $(i_g, j_g)$. The inside of a region whose center is located at $(i_g, j_g)$ and which has a radius of r pixels is now considered. Pixels having sizes of more than $\beta$ times the $\epsilon$ out of pixels adjacent to the region are added to the region, forming a new region. Pixels having sizes of more than $\beta$ times the size $\epsilon$ and adjacent to the new region are also added. In this way, pixels are successively added. The values of pixels not contained in the finally formed region are set to 0.

Pixels which are located within the region and have negative values (and thus pixels of low brightness) are also set to 0. $\alpha$ and $\beta$ are experimentally found parameters. $\alpha$ has a size of about 0.3. $\beta$ has a size of about 2.

Line Profile Extractor

Probe profiles which have been obtained when the beam is underfocused and overfocused, respectively, and from which noises have been removed in (d) are each represented by a two-dimensional image having m pixels (horizontal) and n pixels (vertical). The two-dimensional images are respectively given by $p_{u,ij}$ and $p_{o,ij}$ (i=0, 1, . . . , m−1; j=0, 1, . . . , n−1). The center of gravity of $p_{u,ij}$ is given by

[Mathematical Formula 1]

$$(i_g, j_g) = \frac{\sum_{i,j}(i, j) p_{u,ij}}{\sum_{i,j} p_{u,ij}}$$

The center of gravity of $p_{u,ij}$ is used as the center. N line profiles are taken at regular intervals and given by $f_{u,ki}$ (k=0, 1, . . . , N−1; l=0±1, ±2, . . . ). Note that l=0 corresponds position of the center of gravity. In $f_{u,kl}$, u indicates underfocusing, k indicates direction, and l indicates position. In the case of overfocusing, line profiles of $p_{o,ij}$ are similarly taken and given by $f_{o,kl}$.

(f) Line Profile Feature Amount Extractor

The following amounts are found from the line profile $f_{u,kl}$ found in (e):

[Mathematical Formulas 2]

$$S_{u,k} = \sum_l f_{u,kl} \quad (1)$$

$$T_{u,k} = \sum_l f_{u,kl}^2 \quad (2)$$

$$\mu_{u,k} = \frac{1}{S_{u,k}} \sum_l l \cdot f_{u,kl} \quad (3)$$

$$\sigma_{u,k} = \sqrt{\frac{1}{S_{u,k}} \sum_l l^2 \cdot f_{u,kl}} \quad (4)$$

$$\rho_{u,k} = \frac{\sigma_{u,k}^2}{T_{u,k}} \sum_{\substack{l \\ (l \neq 0)}} \frac{1}{|l|} (f_{u,kl} - f_{u,k0}) \cdot f_{u,kl} \quad (5)$$

where $\mu_{u,kl}$, $\sigma_{u,kl}$, and $\rho_{u,kl}$ are parameters indicating the amounts of features of the line profiles. $\mu_{u,kl}$ indicates the left-and-right asymmetry. $\sigma_{u,kl}$ indicates the width. $\rho_{u,kl}$ indicates unevenness around the center. An example of line profile has been shown in FIG. 3. $S_{o,k}$, $T_{o,k}$, $\mu_{o,k}$, $\sigma_{o,k}$, and $\rho_{o,k}$ are similarly computed using line profiles $f_{o,kl}$ occurring when the beam is overfocused.

(g) Aberration Calculator

The following amounts of aberrations (parameters) $C_0$ to $C_{11}$ for the various aberrations are found from the amounts of features $\mu$, $\sigma$, and $\rho$ of the line profiles found in (f), and are used as measures of the aberrations.

[Mathematical Formulas 3]

$$C_0 = \frac{2}{N} \sum_k (\mu_{u,k} + \mu_{o,k}) \cos\theta_k \quad (x\text{-coma}) \quad (6)$$

$$C_1 = \frac{2}{N} \sum_k (\mu_{u,k} + \mu_{o,k}) \sin\theta_k \quad (y\text{-coma}) \quad (7)$$

$$C_2 = \frac{2}{N} \sum_k (\mu_{u,k} + \mu_{o,k}) \cos3\theta_k \quad (x\text{-triangle}) \quad (8)$$

$$C_3 = \frac{2}{N} \sum_k (\mu_{u,k} + \mu_{o,k}) \sin3\theta_k \quad (y\text{-triangle}) \quad (9)$$

$$C_4 = \frac{1}{N} \sum_k (\sigma_{u,k} - \sigma_{o,k}) \quad (\text{defocus}) \quad (10)$$

$$C_5 = \frac{2}{N} \sum_k (\sigma_{u,k} - \sigma_{o,k}) \cos2\theta_k \quad (xy\text{-astigmatism}) \quad (11)$$

$$C_6 = \frac{2}{N} \sum_k (\sigma_{u,k} - \sigma_{o,k}) \sin2\theta_k \quad (45°\text{-astigmatism}) \quad (12)$$

$$C_7 = \frac{2}{N} \sum_k (\sigma_{u,k} - \sigma_{o,k}) \cos4\theta_k \quad (\cos\text{-4-fold}) \quad (13)$$

-continued $$C_8 = \frac{2}{N} \sum_k (\sigma_{u,k} - \sigma_{o,k}) \sin4\theta_k \quad (\sin\text{-4-fold}) \quad (14)$$

$$C_9 = \frac{1}{N} \sum_k (\rho_{u,k} - \rho_{o,k}) \quad (\text{spherical}) \quad (15)$$

$$C_{10} = \frac{2}{N} \sum_k (\rho_{u,k} - \rho_{o,k}) \sin2\theta_k \quad (xy\text{-star}) \quad (16)$$

$$C_{11} = \frac{2}{N} \sum_k (\rho_{u,k} - \rho_{o,k}) \sin2\theta_k \quad (45°\text{-star}) \quad (17)$$

Figure 4:
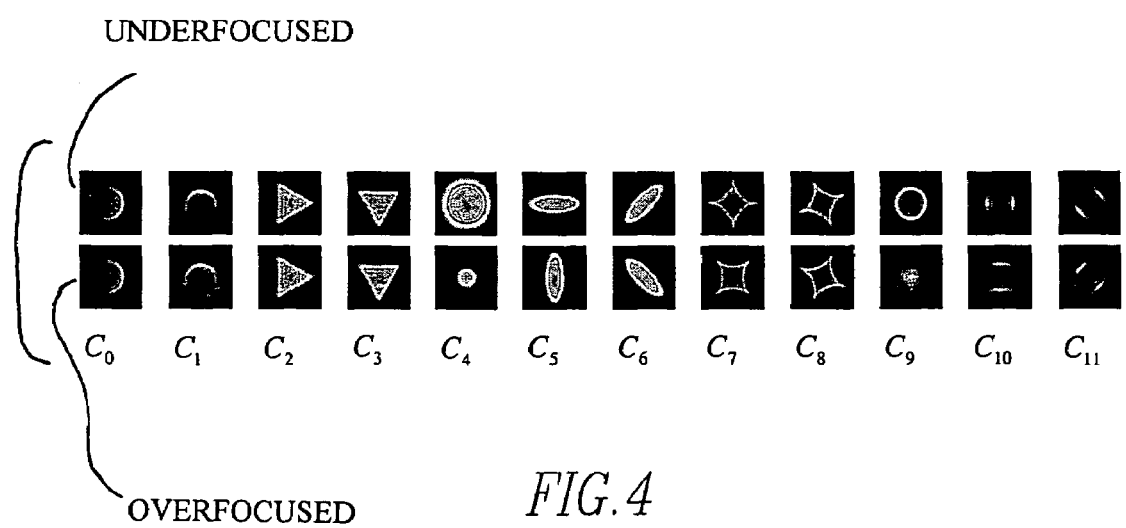
FIG. 4 shows gray scale images showing examples of parameters $C_i$'s on the display screen of a display device in accordance with one embodiment of the present invention.
Figure 5:
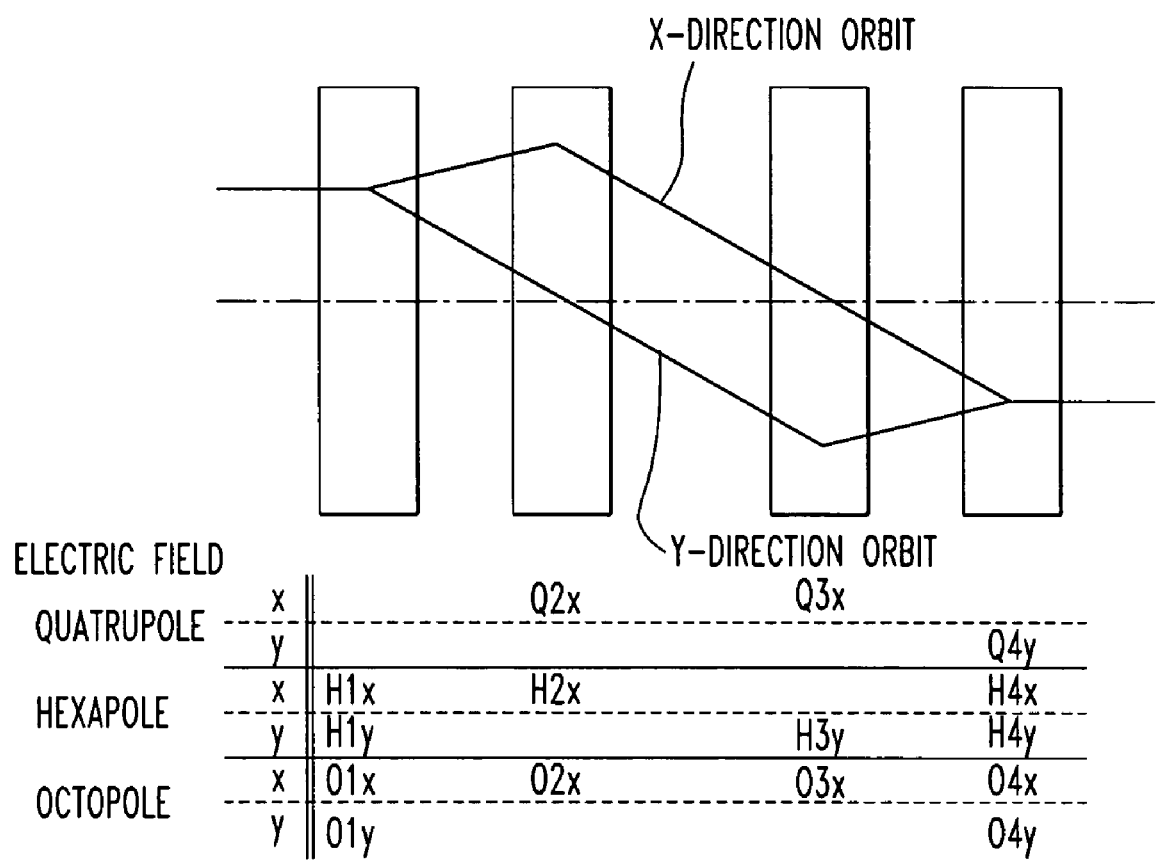
FIG. 5 is a diagram showing one example of aberration corrector.

It can be seen from Equations (6)–(17) that calculations are performed using the amounts of features $\mu$, $\sigma$, and $\rho$ occurring when the beam is overfocused and underfocused. It is to be noted that the assumption $\theta_k = \pi \cdot k/N$ has been made. Typical probe profiles when there are aberrations which make positive $C_0$ to $C_{11}$ and the beam is underfocused or overfocused are shown in FIG. 4, which shows gray scale images of examples of probe profiles for various kinds of aberrations displayed on a display in accordance with one embodiment of the present invention. The upper images were taken when the beam was underfocused. The lower images were taken when the beam was overfocused.

(h) Aberration Correction Decision-Making Device

The aberration correction decision-making device 31 makes a decision as to whether there still remains aberration to be corrected. For example, the value of Mathematical Formula 4 is found:

[Mathematical Formula 4]

$$C = \sqrt{\frac{\sum_{i=0}^{11} W_i C_i^2}{\sum_{i=0}^{11} W_i}}$$

If the relation $C < \delta$ holds, the adjustment of the aberration correction is ended. In the above equation, C is the total amount of aberration, $W_i$ is the weight of each aberration about the decision criterion as to whether convergence has been achieved, and $\delta$ is an allowable value of the total amount of aberration.

The aberration correction decision-making device 31 makes a decision to which aberration should priorly be given in making a correction. Each aberration can be independently quantified. However, when some aberration appears very conspicuously, there is the possibility that the accuracy of quantification of other aberrations deteriorates. Especially, $C_9$, $C_{10}$, and $C_{11}$ have the same symmetry as $C_4$, $C_5$, and $C_6$, respectively, but are higher-order aberrations than the latter aberrations. Therefore, when $C_4$, $C_5$, and $C_6$ appear in large amounts, there is the possibility that the accuracy of quantification of $C_9$, $C_{10}$, and $C_{11}$ deteriorates. To prevent this, a threshold value is set for each individual aberration. If the threshold value is exceeded, only the corresponding aberration is first corrected.

That is, a threshold value $\delta_i$ is previously set for each individual amount of aberration $C_i$ of each aberration. With respect to each aberration amount $C_i$, a decision is made as to whether the relation $C_i < \delta_i$ holds. $C_i$ that satisfies the relation $C_i > \delta_i$ is extracted and specified.

(i) Feedback Amount-Setting Device

A field to be applied to the aberration corrector 22 to correct the aberration specified by the aberration correction decision-making device 31 out of the outputs $C_0$ to $C_{11}$ from the aberration calculator 30 is found. As an example, as shown in FIG. 6, a case is discussed in which an aberration corrector equipped with four stages of electrodes or magnetic poles produces an x-direction line image in the second stage and a y-direction line image in the third stage.

Electric quadrupole, hexapole, and octopole fields can be superimposed on each electrode, in addition to the field for creating the first-order orbit as described above. These fields are represented, using symbols Q1x to Q4x, Q1y to Q4y, H1x to H4x, H1y to H4y, O1x to O4x, and O1y to O4y, where Q, H, and O represent electric quadrupole, hexapole, and octopole fields, respectively. The symbols 1 to 4 indicate what of the four stages of electrodes as counted from the first stage. The symbols x and y indicate normal and skew multipole elements, respectively.

The normal multipole element referred to herein is a field in which variation of potential around the axis is cos Mθ. The skew multipole element is a field in which variation of potential around the axis is sin Mθ. M is an integer indicating the kind of the multipole element, and 2M is the number of the poles. θ is the angle around the axis. In this way, according to the present invention, aberrations in the electron beam can be automatically corrected, using the aberration corrector having the four stages of electrodes or magnetic poles.

Figure 6:
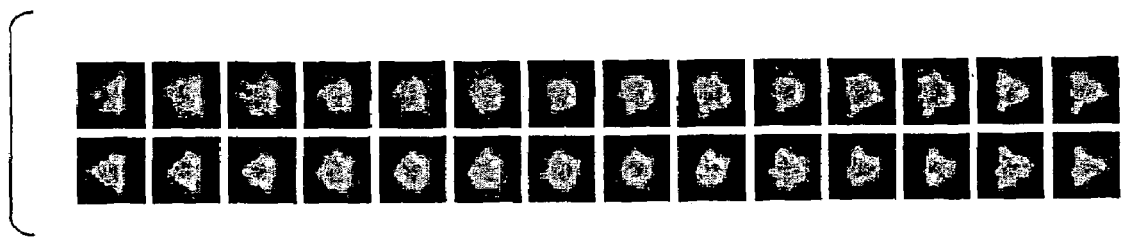
FIG. 6 shows gray scale images showing the profile of a probe on the display screen of a device in accordance with one embodiment of the present invention, showing variations in the profile of the probe when the hexapole field is varied by the aberration corrector.

FIG. 6 shows variations in probe profile when the hexapole field is varied with the aberration corrector. FIG. 6 shows gray scale images of probe profiles within picture images displayed on a display device in accordance with one embodiment of the present invention. As a specific example, variations in probe profile when H1x and H4x were varied at a ratio of H1x:H4x=−1:1 were found experimentally.

Figure 7:
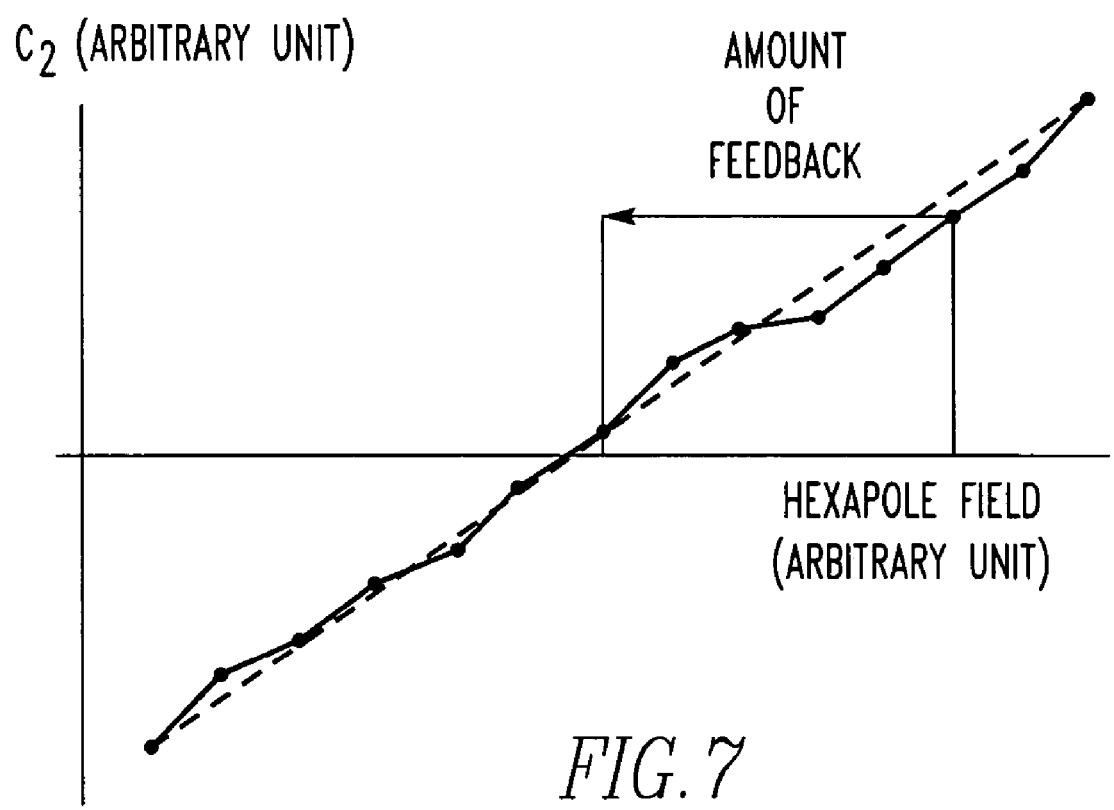
FIG. 7 is a graph showing variations in $C_2$ when the hexapole field is varied.

Quantification of the probe profiles according to Equations (6)–(17) has shown that only $C_2$ shown in Equation (8) varied greatly but the others varied little. Variations in the $C_2$ were graphed as shown in FIG. 7, which shows the relation between the hexapole field and $C_2$. In the graph, the hexapole field is plotted on the horizontal axis, while $C_2$ is on the vertical axis. They are represented in arbitrary units. The value between the value of the hexapole field corresponding to some value of $C_2$ and the value at which $C_2$ is zero is the amount of feedback.

As shown in this graph, there is a linear relationship between $C_0$–$C_{11}$ shown in Equations (6)–(17) and their corresponding fields (see Equations (18)–(29)). Therefore, the tilt of this straight line is previously found by a simulation or experiment. The aberrations can be corrected by multiplying the outputs $C_0$–$C_{11}$ from the aberration calculator 30 by the reciprocals of the tilts of straight lines corresponding to the outputs $C_0$–$C_{11}$ and applying fields that are −1 times these fields to the aberration corrector 22. In practice, the feedback gain may be set to about −0.5 times the reciprocals of the tilts of the straight lines to prevent hunting.

As mentioned previously, the field given by H1x:H4x=−1:1 principally varies only $C_2$. Roughly speaking, fields which principally vary only $C_0$–$C_{11}$, respectively, are as follows.

[Mathematical Formulas 5]

$$C_0: (H1x, H2x, H4x) = (-1, 1, 1) \tag{18}$$

$$C_1: (H1y, H3y, H4y) = (1, 1, -1) \tag{19}$$

$$C_2: (H1x, H4x) = (-1, 1) \tag{20}$$

$$C_3: (H1y, H4y) = (-1, 1) \tag{21}$$

$$C_4: (Q2x, Q3x) = (1, -1) \tag{22}$$

$$C_5: (Q2x, Q3x) = (1, 1) \tag{23}$$

$$C_6: (Q4y) = (1) \tag{24}$$

$$C_7: (Q1x, Q4x) = (1, 1) \tag{25}$$

$$C_8: (Q1x, Q4y) = (1, 1) \tag{26}$$

$$C_9: (O1x, O2x, O3x, O4x) = (2, -1, -1, 2) \tag{27}$$

$$C_{10}: (O2x, O3x) = (-1, 1) \tag{28}$$

$$C_{11}: (O1y, O4y) = (-1, 1) \tag{29}$$

By using the fields of Equations (18)–(29), the feedback gain matrix (described later) becomes a diagonal matrix.

To illustrate this, a simple case in which two aberrations $C_4$ and $C_5$ are corrected using two fields of Q2x and Q3x is now discussed. When Q2x is varied by ΔQ2x, $C_4$ varies by a*ΔQ2x and $C_5$ varies by b*ΔQ2x. Furthermore, when Q3x is varied by ΔQ3x, $C_4$ varies by c*ΔQ3x and $C_5$ varies by d*ΔQ3x. In these formulas, a, b, c, and d are constants.

It is assumed that when Q2x and Q3x are varied by ΔQ2x and ΔQ3x, respectively, $C_4$ and $C_5$ vary by Δ$C_4$ and Δ$C_5$, respectively. These variations Δ$C_4$ and Δ$C_5$ are given by

[Mathematical Formula 6] (30)

$$\begin{pmatrix} \Delta C_4 \\ \Delta C_5 \end{pmatrix} = \begin{pmatrix} a & c \\ b & d \end{pmatrix} \begin{pmatrix} \Delta Q2x \\ \Delta Q3x \end{pmatrix}$$

Thus, ΔQ2x and ΔQ3x are given by

[Mathematical Formula 7] (31)

$$\begin{pmatrix} \Delta Q2x \\ \Delta Q3x \end{pmatrix} = \begin{pmatrix} A & C \\ B & D \end{pmatrix} \begin{pmatrix} \Delta C_4 \\ \Delta C_5 \end{pmatrix}$$

Note that

[Mathematical Formula 8]

$$\begin{pmatrix} A & C \\ B & D \end{pmatrix}$$

is the inverse matrix of

[Mathematical Formula 9]

$$\begin{pmatrix} a & c \\ b & d \end{pmatrix}$$

Consequently, it can be seen that $C_4$ and $C_5$ can both be set to 0 by varying Q2x and Q3x by ΔQ2x and ΔQ3x, respectively, which are given by

[Mathematical Formula 10]

$$\begin{pmatrix} \Delta Q2x \\ \Delta Q3x \end{pmatrix} = \begin{pmatrix} -A & -C \\ -B & -D \end{pmatrix} \begin{pmatrix} C_4 \\ C_5 \end{pmatrix} \quad (32)$$

[Mathematical Formula 11]

$$\begin{pmatrix} -A & -C \\ -B & -D \end{pmatrix}$$

that is included in Equation (32) is known as a feedback gain matrix.

On the other hand, using the fields of Equations (22) and (23) makes the feedback gain matrix a diagonal matrix, for the following reason.

To express the manner in which Q2x and Q3x are varied at a ratio of 1:−1 or at a ratio of 1:1, the field of (Q2x, Q3x)=(1,−1) is abbreviated as q2. The field of (Q2x, Q3x) =(1, 1) is abbreviated as q3. For example, fields given by Q2x=10 and Q3x=6 are equivalent to fields given by q2=2 and q3=8.

Since it is known that when q2 is varied, only $C_4$ varies and when q3 is varied, only $C_5$ varies, it is assumed that when q2 and q3 are varied by Δq2 and Δq3, respectively, $C_4$ and $C_5$ vary by $\Delta C_4$ and $\Delta C_5$, respectively, which are given by

[Mathematical Formula 12]

$$\begin{pmatrix} \Delta C_4 \\ \Delta C_5 \end{pmatrix} = \begin{pmatrix} g_4 & 0 \\ 0 & g_5 \end{pmatrix} \begin{pmatrix} \Delta q2 \\ \Delta q3 \end{pmatrix} \quad (33)$$

where $g_4$ and $g_5$ are constants. Therefore, the following equation holds:

[Mathematical Formula 13]

$$\begin{pmatrix} \Delta q2 \\ \Delta q3 \end{pmatrix} = \begin{pmatrix} G_4 & 0 \\ 0 & G_5 \end{pmatrix} \begin{pmatrix} \Delta C_4 \\ \Delta C_5 \end{pmatrix} \quad (34)$$

where $G_4=1/g_4$ and $G_5=1/g_5$. Thus, it can be seen that q2 and q3 should be varied by Δq2 and Δq3, respectively, in order to set both $C_4$ and $C_5$ to 0, it being noted that Δq2 and Δq3 are given by

[Mathematical Formula 14]

$$\begin{pmatrix} \Delta q2 \\ \Delta q3 \end{pmatrix} = \begin{pmatrix} -G_4 & 0 \\ 0 & -G_5 \end{pmatrix} \begin{pmatrix} C_4 \\ C_5 \end{pmatrix} \quad (35)$$

That is, as shown in this formula, Δq2 and Δq3 can be found as linear combinations of $C_4$ and $C_5$. In this formula, the feedback gain matrix is a diagonal matrix.

Where the fields of Q2x and Q3x are used as in Equation (32), four values A, B, C, and D must be adjusted when the feedback gain is experimentally adjusted or automatically varied. On the other hand, where the fields of q2 and q3 are used as in Equation (35), the feedback gain matrix is a diagonal matrix. Therefore, there are two parameters to be adjusted. Also, there is a direct relationship between the aberration and field. These facilitate understanding.

The aberration-correcting field found in this way is applied to the corrector power supply 33. Since this power supply 33 corrects the aberration corrector 22 according to the input signal, aberrations can be suppressed.

In this way, according to the present invention, the amount of feedback to be applied to the aberration corrector to correct the aberrations in the charged-particle beam is automatically calculated using various processing circuits. Therefore, the operator can automatically correct the aberrations in the beam easily and unconsciously of a complex procedure.

In the above-described embodiment, in a case where the size of the image is sufficiently larger than the sizes of characteristic structures contained in the specimen and so the effects of the four sides of the image can be neglected, the four-side region-blurring device may be omitted.

Furthermore, amounts of features about line profiles are not limited to μ, σ, and ρ as in Equations (3)–(5). Other amounts indicating the left-and-right asymmetry, width, and unevenness around the center may also be used. For example, the conceivable width is not restricted to the standard deviation σ. Half-value width and integral 50% width may also be available.

Further, if the accuracy at which aberrations are quantified from a probe profile is poor, the tendency might be seen by viewing the history of variations in the amounts of aberrations. Therefore, the feedback amount-setting device may take account of the history of variations in the amounts of aberrations. This also produces the advantage that hunting can be prevented.

In addition, the aforementioned method of correcting aberrations can be applied to every kind of aberration corrector. Especially, the method can also be applied to the functions of autofocus and autostigmator.

The advantages of the present invention are as follows.

1. Since the procedure of aberration correction is automated, even a general operator who does not know a manual method of aberration correction can produce high-resolution images.

2. Since aberrations are expressed as Fourier components of μ, σ, and ρ as given in Equations (6)–(17), if two or more aberrations coexist, they can be independently quantified.

3. Since plural aberrations can be corrected at the same time, automatic correction can be made at high speed.

4. Since only large quantified aberrations can be selectively corrected from quantified aberrations, hunting of the system is unlikely to occur.

5. Since fields which make the feedback gain matrix a diagonal matrix are used, it is easy to control different aberrations independently.

Having thus described my invention with the detail and particularity required by the Patent Laws, what is desired protected by Letters Patent is set forth in the following claims.

The invention claimed is:

1. A method of automatically correcting aberrations in a charged-particle beam, comprising:
   a step for extracting line profiles from a probe profile of the charged-particle beam when it has been defocused;
   a step for calculating amounts of features μ, σ, and ρ from the extracted line profiles, the μ, σ, and ρ indicating features of the line profiles, i.e., left-and-right asymmetry, width, and unevenness around the center;

a step for calculating amounts of aberrations in the charged-particle beam from the a mounts of features $\mu$, $\sigma$, and $\rho$;

a step for making a decision as to whether a total amount of aberration in the charged-particle beam calculated based on the amounts of aberrations is less than a given threshold value; and a step for specifying at least one of the amounts of aberrations, calculating an amount of feedback for reducing the specified amount of aberration, and correcting the aberrations in the charged-particle beam based on the amount of feedback when the total amount of aberration has been judged to be greater than the threshold value by the step for making a decision.

2. An apparatus for automatically correcting aberrations in a charged-particle beam, said apparatus comprising:

a line profile extractor means for extracting line profiles from a probe profile of the charged-particle beam when it has been defocused;

a line profile feature amount extractor means for calculating amounts of features $\mu$, $\sigma$, and $\rho$ from the extracted line profiles, the $\mu$, $\sigma$, and $\rho$ indicating features of the line profiles, i.e., left-and-right asymmetry, width, and unevenness around the center;

an aberration amount calculator means for calculating amounts of aberrations in the charged-particle beam from the amounts of features $\mu$, $\sigma$, and $\rho$;

an aberration amount decision-making means for making a decision as to whether a total amount of aberration in the charged-particle beam calculated based on the amounts of aberrations is less than a given threshold value;

a feedback amount-setting means for specifying at least one of the amounts of aberrations and calculating an amount of feedback for reducing the specified amount of aberration; and an aberration corrector means for correcting the aberrations in the charged-particle beam based on the amount of feedback.

3. An apparatus for automatically correcting aberrations in a charged-particle beam as set forth in claim 2, wherein said feedback amount-setting means for finding the amount of feedback as a linear combination of the amounts of aberrations indicated by outputs from said aberration calculator.

4. An apparatus for automatically correcting aberrations as set forth in claim 3, wherein said feedback amount-setting means for calculating the amount of feedback using fields which make a feedback gain matrix a diagonal matrix, the feedback gain matrix indicating relations between the amount of feedback and the amounts of aberrations.

5. An apparatus for automatically correcting aberrations in a charged-particle beam as set forth in claim 2, wherein said aberration corrector is made up of four stages of multipole elements, and wherein line images of the charged-particle beam are created in second and third stages of the corrector.

6. A method of automatically correcting aberrations in a charged-particle beam, comprising:

a step for extracting line profiles from a probe profile of the charged-particle beam when it has been defocused;

a step for calculating amounts of features $\mu$, $\sigma$, and $\rho$ from the extracted line profiles, the $\mu$, $\sigma$, and $\rho$ indicating features of the line profiles, i.e., left-and-right asymmetry, width, and unevenness around the center;

a step for calculating amounts of aberrations in the charged-particle beam from the a mounts of features $\mu$, $\sigma$, and $\rho$;

a step for making a decision as to whether a total amount of aberration in the charged-particle beam calculated based on the amounts of aberrations is less than a given threshold value; and a step for specifying at least one of the amounts of aberrations, calculating an amount of feedback for reducing the specified amount of aberration, and correcting the aberrations in the charged-particle beam based on the amount of feedback when the total amount of aberration has been judged to be greater than the threshold value by the step for making a decision, wherein the amount of feedback is a linear combination of the amounts of aberrations indicated by the step for calculating the amounts of aberrations.

7. A method of automatically correcting aberrations in a charged-particle beam, comprising:

a step for extracting line profiles from a probe profile of the charged-particle beam when it has been defocused;

a step for calculating amounts of features $\mu$, $\sigma$, and $\rho$ from the extracted line profiles, the $\mu$, $\sigma$, and $\rho$ indicating features of the line profiles, i.e., left-and-right asymmetry, width, and unevenness around the center;

a step for calculating amounts of aberrations in the charged-particle beam from the a mounts of features $\mu$, $\sigma$, and $\rho$;

a step for making a decision as to whether a total amount of aberration in the charged-particle beam calculated based on the amounts of aberrations is less than a given threshold value; and a step for specifying at least one of the amounts of aberrations, calculating an amount of feedback for reducing the specified amount of aberration, and correcting the aberrations in the charged-particle beam based on the amount of feedback when the total amount of aberration has been judged to be greater than the threshold value by the step for making a decision, wherein the amount of feedback is calculated using fields which make a feedback gain matrix a diagonal matrix, the feedback gain matrix indicating relations between the amount of feedback and the amounts of aberrations.

* * * * *

UNITED STATES PATENT AND TRADEMARK OFFICE
CERTIFICATE OF CORRECTION

PATENT NO. : 7,095,031 B2  
APPLICATION NO. : 11/016687  
DATED : August 22, 2006  
INVENTOR(S) : Uno Page 1 of 1

It is certified that error appears in the above-identified patent and that said Letters Patent is hereby corrected as shown below:

<u>Title page of the Patent</u>, See Item (56) References Cited, OTHER PUBLICATIONS, the fourth reference to Joachim Zach, Maximilian Haider, line 2, "a multiple corrector" should read -- a multipole corrector --

<u>Column 15</u>, Line 2, Claim 1, "a mounts" should read -- amounts --

<u>Column 16</u>, Line 11, Claim 6, "a mounts" should read -- amounts --

<u>Column 16</u>, Line 37, Claim 7, "a mounts" should read -- amounts --

Signed and Sealed this

Thirteenth Day of February, 2007

JON W. DUDAS  
*Director of the United States Patent and Trademark Office*